United States Patent
Ma et al.

(10) Patent No.: US 10,658,622 B2
(45) Date of Patent: May 19, 2020

(54) DISPLAY DEVICE WITH SUB-PIXEL REGIONS INCLUDING ZONE PLATES HAVING PLURALITY OF RING GROUPS AND MANUFACTURING METHOD THEREOF

(71) Applicant: BOE Technology Group Co., Ltd., Beijing (CN)

(72) Inventors: Xinli Ma, Beijing (CN); Jian Gao, Beijing (CN); Can Wang, Beijing (CN); Jifeng Tan, Beijing (CN); Wei Wang, Beijing (CN); Yafeng Yang, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 110 days.

(21) Appl. No.: 15/795,760

(22) Filed: Oct. 27, 2017

(65) Prior Publication Data

US 2018/0138457 A1 May 17, 2018

(30) Foreign Application Priority Data

Nov. 11, 2016 (CN) .......................... 2016 1 0997972

(51) Int. Cl.
*H01L 51/52* (2006.01)
*G02B 5/18* (2006.01)
(Continued)

(52) U.S. Cl.
CPC ........ *H01L 51/5275* (2013.01); *G02B 5/1876* (2013.01); *G02B 5/1885* (2013.01);
(Continued)

(58) Field of Classification Search
CPC . H01L 51/5275; G02B 5/1876; G02B 5/1885; G02F 1/133524; G02F 1/133526
See application file for complete search history.

(56) References Cited

U.S. PATENT DOCUMENTS

2006/0284052 A1* 12/2006 Toshikiyo ......... H01L 27/14627
250/208.1
2010/0178018 A1* 7/2010 Augusto .................. G02B 6/12
385/131
(Continued)

FOREIGN PATENT DOCUMENTS

CN 101221258 A 7/2008
CN 103676175 A 3/2014
(Continued)

OTHER PUBLICATIONS

Chinese Office Action for Chinese Application No. 201610997972.1 dated Jun. 15, 2018.

*Primary Examiner* — Matthew E. Gordon
(74) *Attorney, Agent, or Firm* — Faye Sharpe LLP

(57) ABSTRACT

The present disclosure provides a display device and a manufacturing method thereof, in the field of display technology. The display device can comprise: a display panel and a light ray control component disposed on a light emergent side of the display panel, wherein the light ray control component comprises a plurality of zone plates; each sub-pixel region on the display panel corresponds to one of the zone plates, and the zone plate corresponding to any sub-pixel region is used to control a direction of light rays emitted from the any sub-pixel region. In the present disclosure, the light ray control component comprising a plurality of zone plates is disposed on the light emergent side of the display panel, and each sub-pixel region of the display panel corresponds to one zone plate. Therefore, the problem in the related art that the light rays emergent from the light (Continued)

emergent side of the display panel are divergent light, and a direction of the light rays is hard to control is solved. The effect of controlling the direction of the light rays emergent from the light emergent side of the display panel by the light ray control component is achieved.

11 Claims, 5 Drawing Sheets

(51) Int. Cl.
*H01L 27/32* (2006.01)
*H01L 51/56* (2006.01)
*G02F 1/1335* (2006.01)

(52) U.S. Cl.
CPC .. *G02F 1/133524* (2013.01); *G02F 1/133526* (2013.01); *H01L 27/3213* (2013.01); *H01L 27/3225* (2013.01); *H01L 51/56* (2013.01); *G02F 1/1335* (2013.01); *G02F 1/133514* (2013.01); *G02F 1/133528* (2013.01); *G02F 2202/28* (2013.01)

(56) References Cited

U.S. PATENT DOCUMENTS

| | | | |
|---|---|---|---|
| 2017/0220844 A1* | 8/2017 | Jones | G06K 9/0053 |
| 2018/0090722 A1* | 3/2018 | Kim | H01L 51/0011 |

FOREIGN PATENT DOCUMENTS

| | | |
|---|---|---|
| CN | 104659139 A | 5/2015 |
| CN | 105629354 A | 6/2016 |
| CN | 105759514 A | 7/2016 |

* cited by examiner

DISPLAY DEVICE WITH SUB-PIXEL REGIONS INCLUDING ZONE PLATES HAVING PLURALITY OF RING GROUPS AND MANUFACTURING METHOD THEREOF

The present application claims priority to the Chinese Patent Application No. 201610997972.1, filed with State Intellectual Property Office on Nov. 11, 2016 and titled "Display Device and Manufacturing Method thereof", which is incorporated herein by reference in its entirety.

TECHNICAL FIELD

The present disclosure relates to display technology, and particularly relates to a display device and a manufacturing method thereof.

BACKGROUND

Display devices are devices having a display function. Display panels are important constituent parts of the display devices. The display panels can comprise liquid crystal (LC) display panels, organic light-emitting diode (OLED) display panels, plasma display panels (PDP), etc.

There exists a display panel in the related art. The display panel comprises a basal substrate and a display structure formed on the basal substrate. The display structure can emit light by itself (for example, the display structure in the OELD display panel is an OLED structure, which can emit light by itself), or can be additionally provided with a backlight source, based on different display structures. Light rays are emitted from a light emergent side of the display panel (the light emergent side is one side of the display structure away from the basal substrate). A user can see an image displayed by the display panel from the light emergent side.

In the process of implementing the present disclosure, the inventors have found that the related art at least has the following problems: the light rays emergent from the light emergent side of the display panel are divergent light, and the direction of the light rays is hard to control.

SUMMARY

The embodiments of the present disclosure provide a display device and a manufacturing method thereof, which could solve the problems that the light rays emergent from the light exit side of the display panel are divergent light, and the direction of the light rays is hard to control in the related art. The technical solutions are as follows:

According to a first aspect of the present disclosure, there is provided a display device. The display device comprises: a display panel and a light ray control component disposed on a light emergent side of the display panel, wherein the light ray control component comprises a plurality of zone plates; the display panel comprises a plurality of pixel regions, each pixel region comprises a plurality of sub-pixel regions, each sub-pixel region corresponds to one of the zone plates, and the zone plate corresponding to any sub-pixel region in the plurality of sub-pixel regions is used to control a direction of light rays emitted from the any sub-pixel region.

In some embodiments, the plurality of zone plates are made of a transparent material, the zone plate corresponding to the any sub-pixel region comprises a first ring group and a second ring group, rings in the first ring group and the rings in the second ring group are alternately disposed from inside to outside along a radial direction of the zone plate, thicknesses of the zone plates at the rings in the first ring group are all a first thickness, thicknesses of the zone plates at the rings in the second ring group are all a second thickness, the absolute value of a thickness difference between the thickness of the zone plate at the rings in the first ring group and the thickness of the zone plate at the rings in the second ring group meets $nd=\lambda/2$, n is a refractive index of a material of the zone plate, d is the thickness difference, and $\lambda$ is a wavelength of the light rays emitted from the any sub-pixel region.

In some embodiments, the first thickness is greater than the second thickness.

In some embodiments, the zone plate corresponding to the any sub-pixel region comprises a third ring group and a fourth ring group, rings in the third ring group and the rings in the fourth ring group are alternately disposed from inside to outside along a radial direction of the zone plate, the rings in the third ring group are transparent rings, and the rings in the fourth ring group are non-transparent rings; or, the rings in the third ring group are non-transparent rings, and the rings in the fourth ring group are transparent rings.

In some embodiments, the ring group whose rings are the non-transparent rings in the third ring group or the fourth ring group is made of a shading material, and the shading material is metal or shading resin.

In some embodiments, the light ray control component further comprises a transparent substrate, the plurality of zone plates are disposed on the transparent substrate, and one side of the transparent substrate provided with the plurality of zone plates is jointed with the light emergent side of the display panel.

In some embodiments, wherein one side of the substrate provided with the plurality of zone plates is attached to the light emergent side of the display panel by an optical clear adhesive (OCA).

In some embodiments, the plurality of zone plates are attached to the light emergent side of the display panel.

In some embodiments, a shape of the zone plate corresponding to the any sub-pixel region is the same as that of the any sub-pixel region.

In some embodiments, the display panel comprises a plurality of self light-emitting structures, one of the self light-emitting structures is disposed in each sub-pixel region respectively, a distance between the zone plate corresponding to the any sub-pixel region and the self light-emitting structure disposed in the any sub-pixel region equals to a focal length of the zone plate corresponding to the any sub-pixel region.

In some embodiments, the plurality of sub-pixel regions comprise sub-pixel regions used to emit red light, sub-pixel regions used to emit green light and sub-pixel regions used to emit blue light.

In some embodiments, the plurality of sub-pixel regions further comprise sub-pixel regions used to emit white light.

In some embodiments, an orthographic projection of a center of the zone plate corresponding to the any sub-pixel region in the any sub-pixel region coincides with the center of the any sub-pixel region.

In some embodiments, a material of the plurality of zone plates comprises an optical resin.

According to a second aspect of the present disclosure, there is provided a manufacturing method for a display device, the method comprising: obtaining a display panel, the display panel comprising a plurality of pixel regions, and each pixel region comprising a plurality of sub-pixel regions; disposing a light ray control component on a light emergent side of the display panel, wherein the light ray control component comprises a plurality of zone plates, each sub-pixel region corresponds to one of the zone plates, and the zone plate corresponding to any sub-pixel region in the plurality of sub-pixel regions is used to control a direction of light rays emitted from the any sub-pixel region.

In some embodiments, the disposing the light ray control component on the light emergent side of the display panel comprises: forming the plurality of zone plates on the light emergent side of the display panel by a patterning process, wherein the plurality of zone plates are made of a transparent material, the zone plate corresponding to the any sub-pixel region comprises a first ring group and a second ring group, rings in the first ring groups and the rings in the second ring groups are alternately disposed from inside to outside along a radial direction of the zone plate, thicknesses of the zone plates at the rings in the first ring group are all a first thickness, thicknesses of the zone plates at the rings in the second ring group are all a second thickness, the absolute value of a thickness difference between the thickness of the zone plate at the rings in the first ring group and the thickness of the zone plate at the rings in the second ring group meets $nd=\lambda/2$, n is a refractive index of a material of the zone plate, d is the thickness difference, and $\lambda$ is a wavelength of the light rays emitted from the any sub-pixel region.

The technical solutions provided by the present disclosure may include the following advantageous benefits:

The light ray control component comprising a plurality of zone plates is disposed on the light emergent side of the display panel, and each sub-pixel region of the display panel corresponds to one zone plate. Therefore, the problem in the related art that the light rays emergent from the light emergent side of the display panel are divergent light, and a direction of the light rays is hard to control is solved. The effect of controlling the direction of the light rays emergent from the light emergent side of the display panel by the light ray control component is achieved.

BRIEF DESCRIPTION OF THE DRAWINGS

To describe the technical solutions in the embodiments of the present disclosure more clearly, the following briefly introduces the accompanying drawings that illustrate aspects of the various embodiments. The accompanying drawings in the following description show some embodiments of the present disclosure, and a person of ordinary skill in the art may derive other drawings from these accompanying drawings.

FIG. 2-1 is a structural schematic diagram of another display device shown in accordance with the embodiments of the present disclosure;

FIG. 2-2 is a structural schematic diagram of a further display device shown in accordance with the embodiments of the present disclosure;

FIG. 2-3 is a structural schematic diagram of a zone plate in the display device shown in FIG. 2-1 or FIG. 2-2;

FIG. 2-4 is a structural schematic diagram of a sub-pixel region in the display device shown in FIG. 2-1;

FIG. 2-5 is a top view of the zone plate shown in FIG. 2-4;

FIG. 2-6 is a structural schematic diagram of another sub-pixel region in the display device shown in FIG. 2-1;

FIG. 2-7 is a top view of the zone plate shown in FIG. 2-6;

FIG. 3-1 is a flowchart of a manufacturing method of a display device in the embodiments of the present disclosure;

FIG. 3-2 is a flowchart of a zone plate formed in the embodiment shown in FIG. 3-1.

Reference indications in the above drawings can be the followings: 11—display panel, 12—light ray control component, p—pixel region, sp—sub-pixel region, 121—zone plate, 122—transparent substrate, OCA—optical clear adhesive, g1—first ring group, g2—second ring group, g3—third ring group, g4—fourth ring group, t1—thicknesses of the zone plates at the rings in the first ring group g1, t2—thicknesses of the zone plates at the rings in the second ring group g2, L—light emitting structure, s—distance between the zone plate 121 corresponding to any sub-pixel region and the self light-emitting structure disposed in the sub-pixel region.

DETAILED DESCRIPTION OF THE EMBODIMENTS

In order to clarify the objects, technical solutions and advantages of the present disclosure, the embodiments of the present disclosure will be further described in detail with reference to the drawings.

Figure 1:
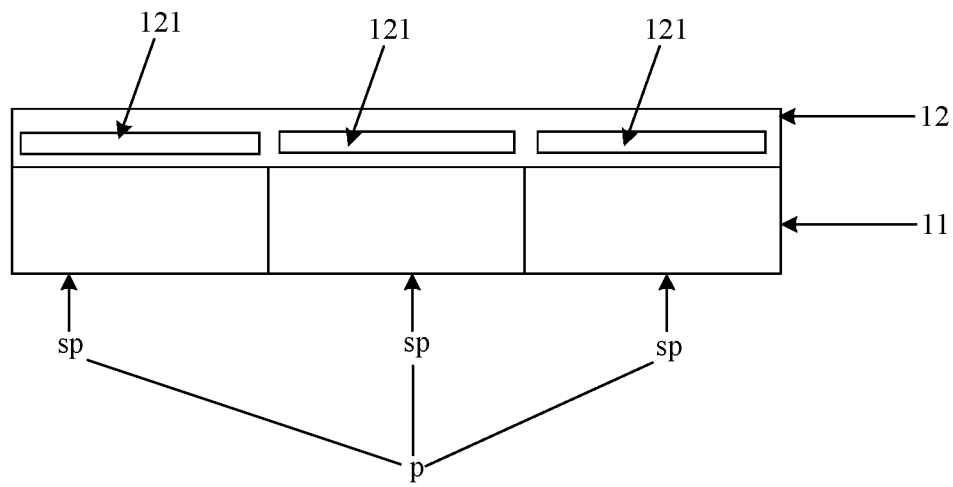
FIG. 1 is a structural schematic diagram of a display device shown in accordance with the embodiments of the present disclosure.

FIG. 1 is a structural schematic diagram of a display device shown by the embodiment of the present disclosure. The display device can comprise:

A display panel 11 and a light ray control component 12 disposed on a light emergent side of the display panel 11. The light ray control component 12 comprises a plurality of zone plates 121. The display panel 11 comprises a plurality of pixel regions p. Each pixel region p comprises a plurality of sub-pixel regions sp. Each sub-pixel region sp corresponds to one zone plate 121. That is, the plurality of sub-pixel regions sp and the plurality of zone plates 12 are in one to one correspondence (the zone plate corresponding to each sub-pixel region in FIG. 1 can be disposed right above such sub-pixel region and covers the same). The zone plate corresponding to any sub-pixel region in the plurality of sub-pixel regions is used to control the direction of light rays emitted from the any sub-pixel region.

Each sub-pixel region in the display panel can emit colored light of one color. That is, different sub-pixel regions in each pixel region in the display panel 11 can emit the colored light of different colors. Exemplarily, one pixel region comprises three sub-pixel regions. These three sub-pixel regions can comprise red, green and blue three sub-pixel regions, which respectively emit red light, green light and blue light. The light ray control component 12 can control the colored light of different colors. In addition, the plurality of sub-pixel regions can also comprise sub-pixel regions used for emitting white light. That is, each pixel region comprises four sub-pixel regions, to improve a display effect.

In addition, the display panel usually comprises a transparent substrate for protecting a display structure in the display panel (for example, a basal substrate in an array substrate and the basal substrate in a color filter substrate in a liquid crystal displayer). In the embodiment of the present disclosure, the display structure in the display panel can be disposed on the basal substrate. While one side of the display structure not provided with the basal substrate can be provided with the transparent substrate, and such transparent structure generally causes no influence on the light rays emitted from the display structure. The light emergent side involved in part or all of the embodiments of the present disclosure can refer to an outer side or inner side of the transparent substrate. That is, the light ray control component can be disposed on any of both sides of the transparent substrate.

In some embodiments, when the display panel is a liquid crystal display panel, the light ray control component can be disposed on the outer side of a polarizing film (that is, one side of the polarizing film away from a liquid crystal layer in the display panel), so that the influence on functions of the polarizing film caused by the light ray control component is avoided.

In FIG. 1, the corresponding relationship between the radius of a ring in the zone plate corresponding to any sub-pixel region and a wavelength of the light rays emitted from the any sub-pixel region can refer to the related art. Exemplarily, the corresponding relationship meets $\rho_k=\sqrt{k\lambda f}$, wherein k is serial number of the ring, the serial number of the ring at the most center is 1, the serial number is sequentially increased from the center to the outside, $\rho_k$ is radius of the kth ring from the center of the zone plate to the outside, $\lambda$ is the wavelength of the light rays emitted from the sub-pixel region corresponding to the zone plate, and f is focal length of the zone plate. Exemplarily, when the light rays emitted from the sub-pixel region are green light, the wavelength $\lambda$ equals to 525 nm (nanometers), and then the radii of the rings in the zone plate corresponding to the sub-pixel region can be sequentially 14.5 μm (micrometers), 20.5 μm, 25.1 μm, etc., from inside to outside.

In conclusion, according to the display device provided by the embodiment of the present disclosure, the light ray control component comprising a plurality of zone plates is disposed on the light emergent side of the display panel, and each sub-pixel region of the display panel corresponds to one zone plate. Therefore, the problem in the related art that the light rays emergent from the light emergent side of the display panel are divergent light, and the direction of the light rays is hard to control is solved. The effect of controlling the direction of the light rays emergent from the light emergent side of the display panel by the light ray control component is achieved.

Figures 1, 2:
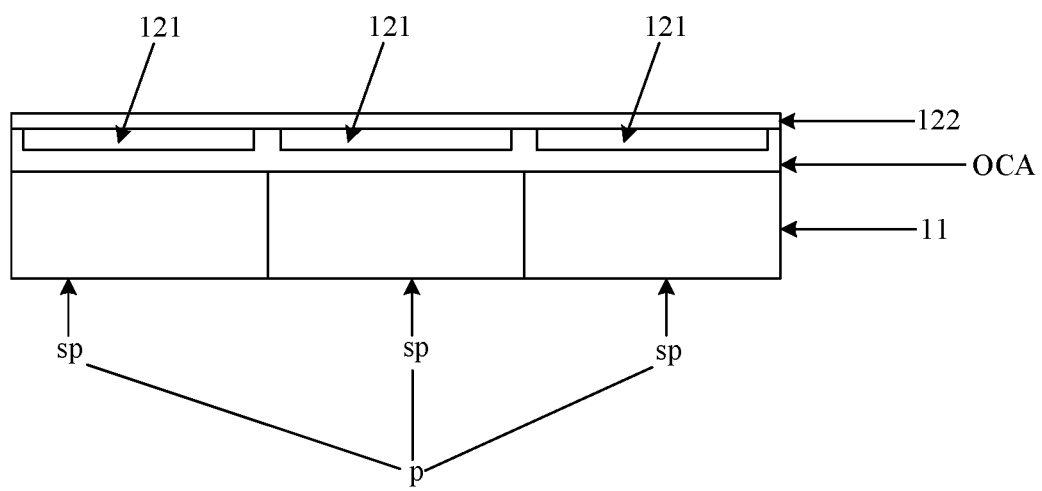
Figure 2:
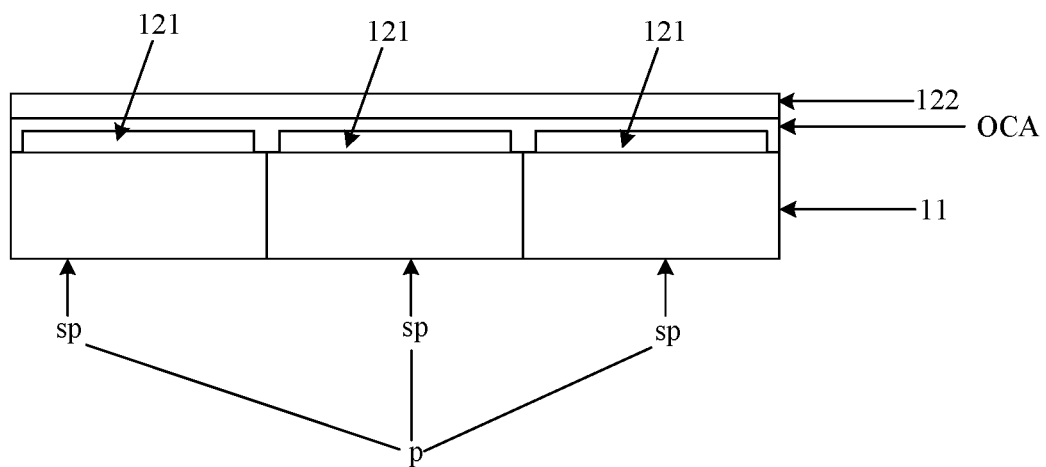

Further, referring to FIG. 2-1, which illustrates a structural schematic diagram of another display device provided by the embodiment of the present disclosure, the display device is additionally provided with some parts based on the display device as shown in FIG. 1.

In some embodiments, the light ray control component further comprises a transparent substrate 122. The plurality of zone plates 121 are disposed on the transparent substrate 122. One side of the transparent substrate 122 provided with the plurality of zone plates is jointed with the light emergent side of the display panel.

In some embodiments, one side of the substrate provided with the plurality of zone plates is attached to the light emergent side of the display panel by an optical clear adhesive (short for OCA). Indications of other signs in FIG. 2-1 can refer to FIG. 1 and are not repeated herein.

In some embodiments, as shown in FIG. 2-2, the plurality of zone plates 121 can be directly attached on the light emergent side of the display panel. Indications of other signs in FIG. 2-2 can refer to FIG. 2-1 and are not repeated herein.

Figures 2, 3:
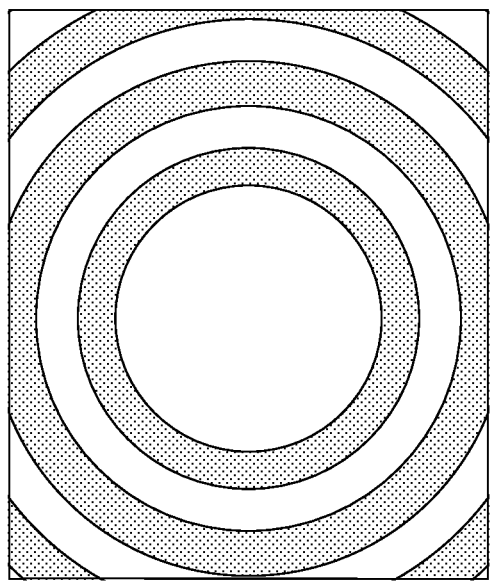

In some embodiments, the shape of the zone plate corresponding to the any sub-pixel region is the same as that of the any sub-pixel region. As shown in FIG. 2-3, when the sub-pixel region is rectangular, the shape of the zone plate can also be rectangular. That is, the zone plate can be rectangular or square. When the shape of the zone plate is the same as that of the sub-pixel region, more light rays emitted from the sub-pixel region will irradiate the zone plate, and thus the zone plate can control more light rays.

In some embodiments, centers of the zone plates can be aligned with those of the sub-pixel regions. In this way, the zone plates can play a role of better control over the light rays emitted from the sub-pixel regions. That is, an orthographic projection of the center of the zone plate corresponding to the any sub-pixel region in the any sub-pixel region coincides with the center of the any sub-pixel region.

The zone plates in the light ray control component in the display device provided by the embodiment of the present disclosure comprise at least one of two kinds of the following zone plates.

The first kind of zone plates: the plurality of zone plates are made of a transparent material. The transparent material can comprise the material with a higher transmittance, such as optical resin.

Figures 2, 3, 4:
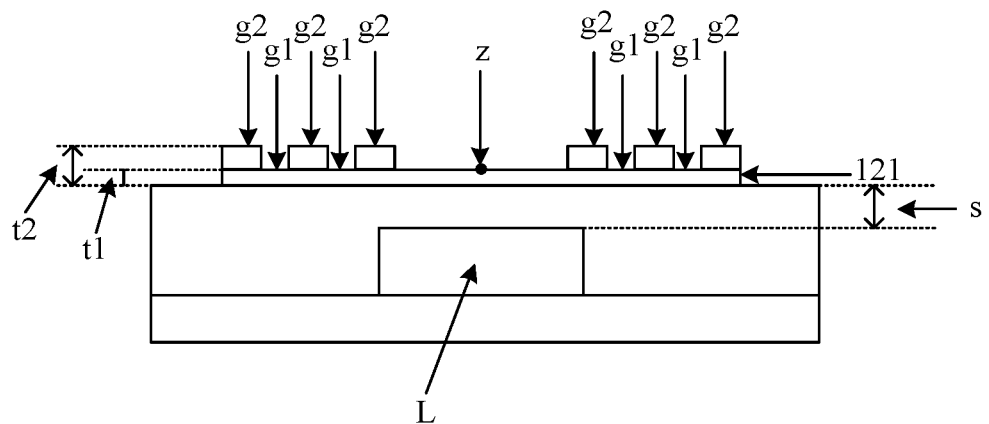
Figures 2, 3, 4, 5:
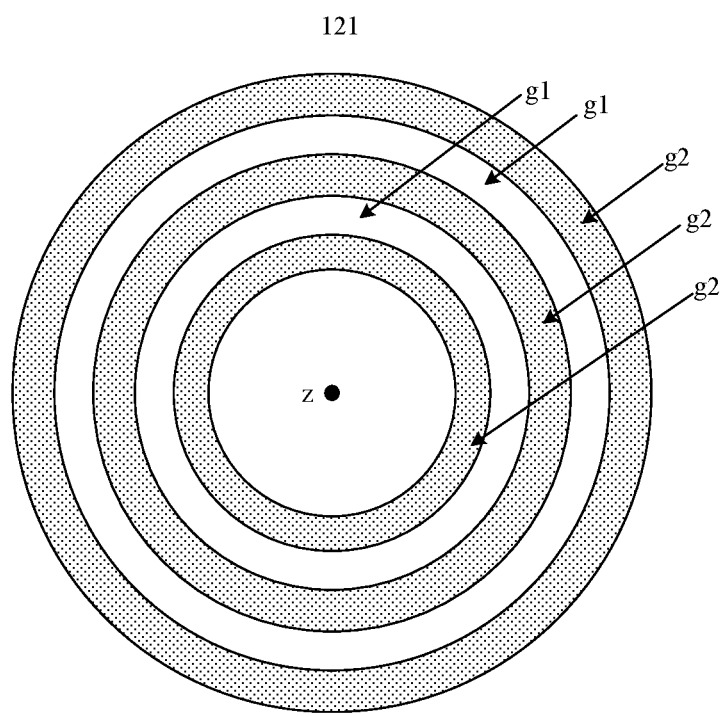
Figures 2, 3, 4, 5, 6:
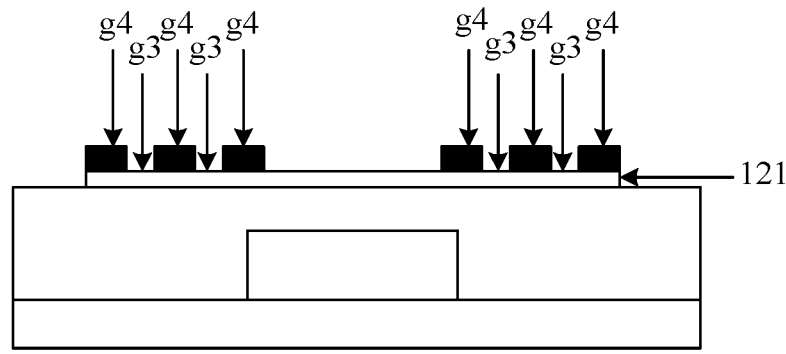
Figures 2, 3, 4, 5, 6, 7:
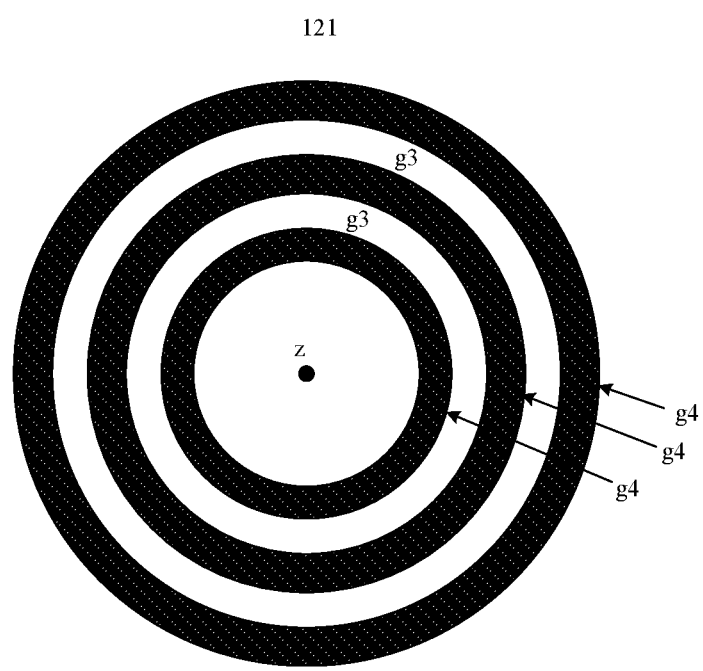
Figures 1, 3:
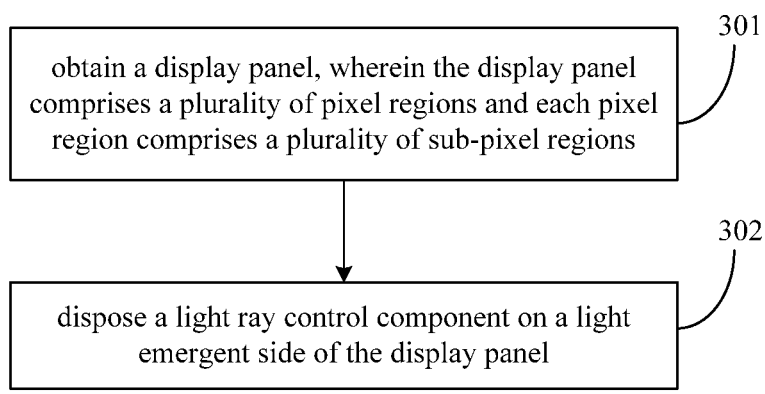
Figures 2, 3:
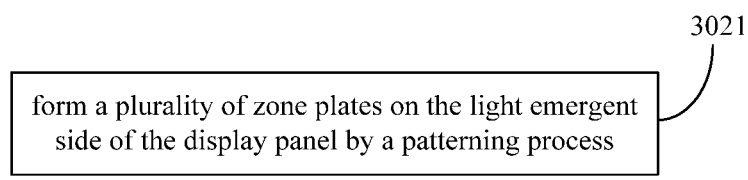

As shown in FIG. 2-4, which is a structural schematic diagram of one sub-pixel region in the display panel as shown in FIG. 2-1, the zone plate 121 corresponding to such sub-pixel region comprises a first ring group g1 and a second ring group g2. Rings in the first ring group g1 and the rings in the second ring group g2 are alternately disposed from inside to outside along a radial direction (a direction outwards radiant from the center z of the zone plate) of the zone plate 121. Thicknesses of the zone plates at the rings in the first ring group g1 are all first thickness t1, and thicknesses of the zone plates at the rings in the second ring group g2 are all second thickness t2. The absolute value of a thickness difference between the thickness t1 of the zone plate at the rings in the first ring group g1 and the thickness t2 of the zone plate at the rings in the second ring group g2 meets $nd=\lambda/2$, wherein n is a refractive index of a material of the zone plate, d is the thickness difference, and $\lambda$ is a wavelength of the light rays emitted from the sub-pixel region. In the embodiment of the present disclosure, the zone plate at the rings in the first ring group g1 can be thicker relative to the zone plate at the rings in the second ring group g2. That is, the first thickness is greater than the second thickness. At this point, the thickness of a circle in the center of the zone plate is thinner, and a transmittance of the zone plate is increased. Or the zone plate at the rings in the second ring group g2 can be thicker relative to the zone plate at the rings in the first ring group 1 (FIG. 2-4 illustrates such case), which is not limited by the embodiment of the present disclosure. When the thickness difference between the thickness of the zone plate at the rings in the first ring group g1 and the thickness of the zone plate at the rings in the second ring group meets $nd=\lambda/2$, and when the light rays emitted from the sub-pixel region corresponding to such zone plate pass by the rings in the two ring groups, phase positions of the light rays passing by the two ring groups will become identical. As a result, the light rays passing by the two ring groups can be superimposed to enhance the vibration amplitude. As shown in FIG. 2-5, which is a top view of FIG. 2-4, the rings in the first ring group g1 and the rings in the second ring group g2 are alternately disposed from inside to outside along a direction outwards radiant from the center z of the zone plate. The signs in FIG. 2-5 can refer to FIG. 2-4 and are not repeated herein.

In some embodiments, these two kinds of ring groups having a height difference can be manufactured by a patterning process. The manufacturing process is relatively simple and convenient.

In some embodiments, the ring located in the most center can be a ring with larger thickness (FIGS. 2-4 and 2-5 illustrate such case), or a ring with smaller thickness, which is not limited by the embodiment of the present disclosure. The structure of the zone plate can also refer to the related art and is not repeated herein.

The second kind of zone plates: as shown in FIG. 2-6, which is a structural schematic diagram of a zone plate corresponding to another sub-pixel region (the sub-pixel region can be any one sub-pixel region in the display panel) in the display panel as shown in FIG. 2-1. The zone plate 121 corresponding to such sub-pixel region comprises a third ring group g3 and a fourth ring group g4. The rings in the third ring group g3 and the rings in the fourth ring group g4 are alternately disposed from inside to outside along a radial direction of the zone plate 121. Rings in the third ring group g3 are transparent rings, and the rings in the fourth ring group g4 are non-transparent rings (FIG. 2-6 illustrates such case). In addition, the rings in the third ring group g3 can also be non-transparent rings, and the rings in the fourth ring group g4 are transparent rings, which is not limited by the embodiment of the present disclosure. The non-transparent rings in the zone plate can be made of a black matrix (BM) or non-transparent metal. That is, the ring group of the non-transparent rings can be made of a shading material, and the shading material can be metal or shading resin. The pattern of such zone plate can be formed by a patterning process, and the manufacturing process is relatively simple and convenient. As shown in FIG. 2-7, which is a top view of FIG. 2-6, the rings in the third ring group g3 and the rings in the fourth ring group g4 are alternately disposed from inside to outside along a direction outwards radiant from the center z of the zone plate 121. The signs in FIG. 2-7 can refer to FIG. 2-6 and are not repeated herein.

It should be also noted that the ring located in the most center can be a transparent or non-transparent ring (FIGS. 2-6 and 2-7 illustrate such cases), which is not limited by the embodiment of the present disclosure. In addition, the structure of the zone plate can also refer to the related art and is not repeated herein.

In some embodiments, the display panel can comprise a plurality of self light-emitting structures. One self light-emitting structure is disposed in each sub-pixel region respectively. According to different types of the display panels, the self light-emitting structures can be OLED light-emitting structures or PDP light-emitting structures.

As shown in FIG. 2-4, a distance s between the zone plate 121 corresponding to the any sub-pixel region and the self light-emitting structure L disposed in such sub-pixel region equals to a focal length of the zone plate 121 corresponding to the sub-pixel region. The zone plate has the function of a convex lens, that is, the zone plate has a characteristic of condensing light rays. While the distance between the zone plate corresponding to the any sub-pixel region and the self light-emitting structure disposed in such sub-pixel region is enabled to equal to the focal length of the zone plate corresponding to the sub-pixel region, that is, the self light-emitting structure is disposed on a focal point of the zone plate. As a result, the light emitted from the self light-emitting structure will become parallel light after passing by the zone plate. While the light emitted from each self light-emitting structure in the display panel is adjusted to be the parallel light to achieve an anti-peep effect (only people directly facing the display panel can see a picture displayed by the display panel, while the picture displayed by the display panel is hard to see from other angles). Additionally, it is also convenient to change various parameters of the light rays by subsequent components. Exemplarily, other components for changing the direction of the light rays can be added outside the light ray control component.

In conclusion, according to the display device provided by the embodiment of the present disclosure, the light ray control component comprising a plurality of zone plates is disposed on the light emergent side of the display panel, and each sub-pixel region of the display panel corresponds to a zone plate. Therefore, the problem in the related art that the light rays emergent from the light emergent side of the display panel are divergent light, and the direction of the light rays is hard to control is solved. The effect of controlling the direction of the light rays emergent from the light emergent side of the display panel by the light ray control component is achieved.

FIG. 3-1 is a flowchart of a manufacturing method of a display device provided by the embodiment of the present disclosure. The method can be used to manufacture the display device as shown in FIG. 1, FIG. 2-1 or FIG. 2-2. The method comprises:

At step 301: a display panel is obtained. The display panel comprises a plurality of pixel regions, and each pixel region comprises a plurality of sub-pixel regions.

When the manufacturing method of a display device of the disclosed embodiment is used, the display panel can be obtained at first. The display panel comprises a plurality of pixel regions, and each pixel region comprises a plurality of sub-pixel regions.

The display panel can be a liquid crystal display panel, an OLED display panel or PDP.

At step 302: a light ray control component is disposed on a light emergent side of the display panel.

After the display panel is obtained, the light ray control component can be disposed on the light emergent side of the display panel. The light ray control component comprises a plurality of zone plates, and each sub-pixel region corresponds to one zone plate. The radius of the ring in the zone plate corresponding to the any sub-pixel region in the plurality of sub-pixel regions corresponds to a wavelength of the light rays emitted from the any sub-pixel region. The corresponding relationship can refer to the embodiment as shown in FIG. 1 and is not repeated herein. The zone plate corresponding to the any sub-pixel region is used to control the direction of light rays emitted from the any sub-pixel region.

As shown in FIG. 3-2, this step can comprise one following sub-step:

At sub-step 3021: a plurality of zone plates are formed on the light emergent side of the display panel by a patterning process.

The plurality of zone plates with higher precision are formed by the patterning process. Wherein, the patterning process can comprise the steps such as coating, exposure, developing, etching, peeling and the like, and specifically can refer to the related art, which are not repeated herein.

The structure of the zone plate formed in this step can refer to the embodiment as shown in FIG. 2-1 and is not repeated herein.

Wherein, the zone plates can be directly formed on the light emergent side of the display panel, and can also be formed on a transparent substrate located in the light emergent side of the display panel. The substrate can be attached to the light emergent side of the display panel. The plurality of zone plates are made of a transparent material. The zone plate corresponding to the any sub-pixel region comprises a first ring group and a second ring group. Rings in the first ring group and the rings in the second ring group are alternately disposed from inside to outside along a radial direction of the zone plate. Thicknesses of the zone plates at the rings in the first ring group are all first thickness, and thicknesses of the zone plates at the rings in the second ring group are all second thickness. The absolute value of a thickness difference between the thickness of the zone plate at the rings in the first ring group and the thickness of the zone plate at the rings in the second ring group meets nd=λ/2, n is a refractive index of a material of the zone plate, d is the thickness difference, and λ is a wavelength of the light rays emitted from the any sub-pixel region. The structure of the zone plate can refer to the embodiment as shown in FIG. 2-1 and is not repeated herein.

In conclusion, according to the method for manufacturing the display device provided by the embodiment of the present disclosure, the light ray control component comprising a plurality of zone plates is disposed on the light emergent side of the display panel, and each sub-pixel region of the display panel corresponds to one zone plate. Therefore, the problem in the related art that the light rays emergent from the light emergent side of the display panel are divergent light, and the direction of the light rays is hard to control is solved. The effect of controlling the direction of the light rays emergent from the light emergent side of the display panel by the light ray control component is achieved.

The term "at least one of A and B" in the present disclosure only describes the correspondence of the corresponding objects, indicating three kinds of relationship. For example, it can be expressed as: A exists alone, A and B exist concurrently, B exists alone. The character "/" generally indicates that the context object is an "OR" relationship. The term "plurality" herein refers to at least two.

Persons of ordinary skill in the art can understand that all or part of the steps described in the above embodiments can be completed by hardware, or by relevant hardware instructed by programs. The programs can be stored a non-transitory computer readable storage medium, which can be a read only memory, a disk or a CD.

The foregoing are only some embodiments and are not intended to limit the disclosure. Within the spirit and principles of the disclosure, any modifications, equivalent substitutions, improvements, etc., are protected within the scope of the present disclosure.

What is claimed is:

1. A display device, comprising:
   a display panel and a light ray control component disposed on a light emergent side of the display panel, wherein the light ray control component comprises a plurality of zone plates,
   wherein the display panel comprises a plurality of pixel regions, each pixel region comprises a plurality of sub-pixel regions, each sub-pixel region corresponds to one of the plurality of zone plates, and the one of the plurality of zone plates corresponding to any sub-pixel region in the plurality of sub-pixel regions is used to control a direction of light rays emitted from the any sub-pixel region,
   wherein the plurality of zone plates are made of a transparent material, the one of the plurality of zone plates corresponding to the any sub-pixel region comprises a first ring group and a second ring group, rings in the first ring group and rings in the second ring group are alternately disposed from inside to outside along a radial direction of the one of the plurality of zone plate; and
   wherein thicknesses of the plurality of zone plates at the rings in the first ring group each have a first thickness, thicknesses of the plurality of zone plates at the rings in the second ring group each have a second thickness, the absolute value of a thickness difference between the first thickness of the one of the plurality of zone plates at the rings in the first ring group and the second thickness of the one of the plurality of zone plates at the rings in the second ring group meets nd=λ/2, wherein n is a refractive index of a material of the one of the plurality of zone plates, d is the thickness difference, and λ is a wavelength of the light rays emitted from the any sub-pixel region.

2. The display device according to claim 1, wherein the light ray control component further comprises a transparent substrate, the plurality of zone plates are disposed on the transparent substrate, and a side of the transparent substrate provided with the plurality of zone plates is jointed with the light emergent side of the display panel.

3. The display device according to claim 2, wherein the side of the transparent substrate provided with the plurality of zone plates is attached to the light emergent side of the display panel by an optical clear adhesive (OCA).

4. The display device according to claim 1, wherein the plurality of zone plates are attached to the light emergent side of the display panel.

5. The display device according to claim 1, wherein a shape of the zone plate corresponding to the any sub-pixel region is the same as that of the any sub-pixel region.

6. The display device according to claim 1, wherein the display panel comprises a plurality of self light-emitting structures, wherein one of the self light-emitting structures is disposed in each sub-pixel region respectively, and
   wherein a distance between the one of the plurality of zone plates corresponding to the any sub-pixel region and the self light-emitting structure disposed in the any sub-pixel region equals to a focal length of the one of the plurality of zone plates corresponding to the any sub-pixel region.

7. The display device according to claim 1, wherein the plurality of sub-pixel regions comprise sub-pixel regions used to emit red light, sub-pixel regions used to emit green light and sub-pixel regions used to emit blue light.

8. The display device according to claim 7, wherein the plurality of sub-pixel regions further comprise sub-pixel regions used to emit white light.

9. The display device according to claim 1, wherein an orthographic projection of a center of the zone plate corresponding to the any sub-pixel region in the plurality of sub-pixel regions coincides with the center of the any sub-pixel region.

10. The display device according to claim 1, wherein a material of the plurality of zone plates comprises an optical resin.

11. A manufacturing method for a display device, comprising:
   obtaining a display panel, the display panel comprising a plurality of pixel regions, and each pixel region of the plurality of pixel regions comprising a plurality of sub-pixel regions; and
   disposing a light ray control component on a light emergent side of the display panel, wherein the light ray control component comprises a plurality of zone plates, each sub-pixel region of the plurality of sub-pixel regions corresponds to one of the plurality of zone plates, and the one of the plurality of zone plates corresponding to any sub-pixel region in the plurality of sub-pixel regions is used to control a direction of light rays emitted from the any sub-pixel region,
   wherein disposing the light ray control component on the light emergent side of the display panel comprises:

forming the plurality of zone plates on the light emergent side of the display panel by a patterning process, wherein the plurality of zone plates is made of a transparent material, the one of the plurality of zone plates corresponding to the any sub-pixel region comprises a first ring group and a second ring group, rings in the first ring group and rings in the second ring group are alternately disposed from inside to outside along a radial direction of the one of the plurality of zone plate, thicknesses of the plurality of zone plates at the rings in the first ring group each have a first thickness, thicknesses of the plurality of zone plates at the rings in the second ring group each have a second thickness, the absolute value of a thickness difference between the first thickness of the one of the plurality of zone plates at the rings in the first ring group and the second thickness of the one of the plurality of zone plates at the rings in the second ring group meets $nd=\lambda/2$, wherein n is a refractive index of a material of the one of the plurality of zone plates, d is the thickness difference, and $\lambda$ is a wavelength of the light rays emitted from the any sub-pixel region.

\* \* \* \* \*